United States Patent
Yang et al.

(10) Patent No.: US 7,804,550 B2
(45) Date of Patent: Sep. 28, 2010

(54) LIQUID CRYSTAL DISPLAY DEVICE AND METHOD OF FABRICATING THE SAME

(75) Inventors: Joon Young Yang, Bucheon (KR); Yong In Park, Seoul (KR); Sang Hyun Kim, Anyang (KR)

(73) Assignee: LG Display Co., Ltd., Seoul (KR)

( * ) Notice: Subject to any disclaimer, the term of this patent is extended or adjusted under 35 U.S.C. 154(b) by 539 days.

(21) Appl. No.: 11/704,267

(22) Filed: Feb. 9, 2007

(65) Prior Publication Data

US 2007/0146567 A1 Jun. 28, 2007

Related U.S. Application Data

(62) Division of application No. 10/878,311, filed on Jun. 29, 2004, now Pat. No. 7,215,387.

(30) Foreign Application Priority Data

Dec. 23, 2003 (KR) ................................ 2003-95760

(51) Int. Cl.
G02F 1/136 (2006.01)
G02F 1/1333 (2006.01)
(52) U.S. Cl. .............................. 349/43; 349/138; 349/47
(58) Field of Classification Search .................. None
See application file for complete search history.

(56) References Cited

U.S. PATENT DOCUMENTS 6,137,551 A * 10/2000 Jeong .......................... 349/38
6,204,520 B1 * 3/2001 Ha et al. ....................... 257/72
6,337,234 B2 1/2002 Ha et al.
6,440,784 B2 8/2002 Lee

OTHER PUBLICATIONS

Abstract of Machine translation of JP 02-042419.*

* cited by examiner

*Primary Examiner*—David Nelms
*Assistant Examiner*—Lucy P Chien
(74) *Attorney, Agent, or Firm*—McKenna Long & Aldridge

(57) ABSTRACT

A method of fabricating a liquid crystal display device includes forming an active pattern and a data line on a substrate, forming a first insulating layer on the data line, forming a second insulating layer on the substrate, forming a gate electrode on the second insulating layer above the active pattern, forming a third insulating layer on the substrate, forming first and second contact holes through the second and third insulating layers to expose first and second portions of the active pattern, and forming a third contact hole through the first, second, and third insulating layers exposing a portion of the data line, respectively, and forming source and drain electrodes on the third insulating layer, the source electrode connected to the first exposed portion of the active pattern through the first contact hole and connected to the first exposed portion of the data line through the third contact hole, and the drain electrode connected to the second exposed portion of the active pattern through the second contact hole.

5 Claims, 9 Drawing Sheets

LIQUID CRYSTAL DISPLAY DEVICE AND METHOD OF FABRICATING THE SAME

This application is a Divisional of prior application Ser. No. 10/878,311, filed Jun. 29, 2004, now U.S. Pat. No. 7,215,387, which claims the benefit of Korean Patent Application No. 2003/095760 filed in Korea on Dec. 23, 2003, which are hereby incorporated by reference for all purposes as if fully set forth herein.

BACKGROUND OF THE INVENTION

1. Field of the Invention

The present invention relates to a display device and a method of fabricating a display device, and more particularly, to a liquid crystal display (LCD) device and a method of fabrication an LCD device.

2. Description of the Related Art

As the need for visual display devices increases, requirements for improved display devices having low power consumption, thin profiles, light weight, and high image quality has increased. One example of an improved display device is an LCD device that is suitable for mass-production. Accordingly, the LCD device has been developed to replace conventional cathode ray tube (CRT) devices.

In general, an LCD device displays images by adjusting light transmittance ratios of liquid crystal cells by respectively supplying data signals according to image information to the liquid crystal cells arranged as a matrix configuration. Accordingly, the LCD device includes a color filter substrate, an array substrate, and a liquid crystal material layer formed between the color filter and array substrates. In addition, a thin film transistor (TFT) is commonly used as a switching device of the LCD device, wherein the TFT includes one of amorphous or polycrystalline silicon as a channel layer.

During fabrication of the LCD device, a great number of mask processes (that is, a photolithography process) are required to fabricate the array substrate including the thin film transistor. Thus, to more efficiently produce LCD devices, there is a need to reduce the number of the mask processes.

FIG. 1 is a partial plan view of an array substrate for an LCD device according to the related art. In FIG. 1, a plurality of gate lines 16 and data lines 17 are arranged on an array substrate 10 along first and second directions, respectively, to define a plurality of pixel regions. In addition, a thin film transistor (TFT) is formed at each crossing of the gate and data lines 16 and 17 and a pixel electrode 18 is formed at each of the pixel regions.

The TFT includes a gate electrode 21 connected to the gate line 16, a source electrode 22 connected to the data line 17, and a drain electrode 23 connected to the pixel electrode 18. In addition, although not shown, the TFT includes first and second insulating layers for insulating the gate electrode 21 and the source/drain electrodes 22 and 23. Furthermore, the TFT includes an active layer 24 that includes a conductive channel between the source electrode 22 and the drain electrode 23 by application of a gate voltage to the gate electrode 21.

In FIG. 1, the source electrode 22 is electrically connected to a source region of the active layer 24 through a first contact hole 40a formed on the insulating layers (not shown), and the drain electrode 23 is electrically connected to a drain region of the active layer 24 through the first contact hole 40a. Although not shown, a third insulating layer is provided with a second contact hole 40b formed on the drain electrode 23, wherein the drain electrode 23 and the pixel electrode 18 are electrically connected to each other through the second contact hole 40b.

Hereinafter, a fabrication process of a general liquid crystal display device will be described in more detail with reference to FIGS. 2A to 2F.

FIGS. 2A to 2F are cross sectional views along I-I' of FIG. 1 of a method for fabricating an LCD device according to the related art. In FIG. 2A, an active pattern 24 composed of a polycrystalline silicon layer is formed on the substrate 10 using a photolithographic process.

In FIG. 2B, a first insulating layer 15a and a conductive metal layer are sequentially deposited along an entire surface of the substrate 10 where the active pattern 24 is formed. Then, the conductive metal material is patterned by using a photolithographic process; thereby forming a gate electrode 21 on the active pattern 24 with the first insulating layer 15a interposed therebetween. Next, high concentration impurity ions are injected into predetermined regions of the active pattern 24 using the gate electrode 21 as a mask, thereby forming p+ or n+ type source/drain regions 24a and 24b.

In FIG. 2C, a second insulating layer 15b is deposited along an entire surface of the substrate 10 where the gate electrode 21 is formed, and the second and first insulating layers 15b and 15a are partially removed by a photolithographic process, thereby forming first contact holes 40a that partially expose the source/drain regions 24a and 24b.

In FIG. 2D, a conductive metal material is deposited along an entire surface of the substrate 10 and a photolithographic process is performed to forming a source electrode 22 connected to the source region 24a and a drain electrode 23 connected to the drain region 24b through the first contact hole 40a. In addition, a portion of the conductive metal layer constituting the source electrode 22 is extended along one direction to form a data line 17.

In FIG. 2E, a third insulating layer 15c is deposited along an entire surface of the substrate 10, and a second contact hole 40b is formed by a photolithographic process to expose a part of the drain electrode 23.

In FIG. 2F, a transparent conductive material is deposited along an entire surface of the substrate 10 where the third insulating layer 15c is formed, and a pixel electrode 18 connected to the drain electrode 23 through the second contact hole 40b is formed by a photolithographic process.

During the fabrication method of the LCD device, at least six separate photolithographic processes are required to pattern the active pattern, the gate electrode, the first contact hole, the source/drain electrode, the second contact hole, and the pixel electrode. Each of the six photolithographic processes includes a series of processes for forming a desired pattern by transferring a pattern formed on a mask onto a substrate where a thin film is deposited. Then, a plurality of processes including photoresist deposition, light exposure, and a development process are performed. Accordingly, these photolithographic processes reduce production yield and may generate defects during formation of the TFT. In addition, since masks for forming the various patterns are very expensive, when the number of masks used during the fabrication processes increases, fabrication costs of the LCD device proportionally increases.

SUMMARY OF THE INVENTION

Accordingly, the present invention is directed to an LCD device and a method of fabricating an LCD device that substantially obviates one or more the problems due to limitations and disadvantages of the related art.

An object of the present invention is to provide an LCD device fabricated using a reduced number of fabrication processes.

Another object of the present invention is to provide a method of fabricating an LCD device having a reduced number of fabrication processes.

To achieve these and other advantages and in accordance with the purpose of the present invention, as embodied and broadly described, a method of fabricating a liquid crystal display device includes forming an active pattern and a data line on a substrate, forming a first insulating layer on the data line, forming a second insulating layer on the substrate, forming a gate electrode on the second insulating layer above the active pattern, forming a third insulating layer on the substrate, forming first and second contact holes through the second and third insulating layers to expose first and second portions of the active pattern, and forming a third contact hole through the first, second, and third insulating layers exposing a portion of the data line, respectively, and forming source and drain electrodes on the third insulating layer, the source electrode connected to the first exposed portion of the active pattern through the first contact hole and connected to the first exposed portion of the data line through the third contact hole, and the drain electrode connected to the second exposed portion of the active pattern through the second contact hole.

In another aspect, a liquid crystal display device includes an active pattern and a data line formed on a substrate, a first insulating layer on the data line, a second insulating layer on the substrate, a gate electrode formed on the second insulating layer above the active pattern, a third insulating layer formed on the substrate, first and second contact holes extending through the second and third insulating layers to expose first and second portions of the active pattern, respectively, a third contact hole extending through the first, second, and third insulating layers to expose a portion of the data line, a source electrode formed on the third insulating layer, the source electrode having a first portion within the first contact hole to contact the exposed first portion of the active pattern and a second portion within the third contact hole to contact the exposed portion of the data line, and a drain electrode formed on the third insulating layer, the drain electrode having a first portion within the second contact hole to contact the exposed second portion of the active pattern and a second portion extending into a pixel region of the liquid crystal display device.

In another aspect, a method of fabricating a liquid crystal display device includes forming an active pattern and a data line on a substrate, forming a first insulating layer on the substrate, forming a second insulating layer overlying the first insulating layer above the data line, forming a gate electrode on the first insulating layer above the active pattern, forming a third insulating layer on the substrate, forming first and second contact holes through the first and third insulating layers to expose first and second portions of the active pattern, and forming a third contact hole through the first, second, and third insulating layers exposing a portion of the data line, respectively, and forming source and drain electrodes on the third insulating layer, the source electrode connected to the first exposed portion of the active pattern through the first contact hole and connected to the exposed portion of the data line through the third contact hole, and the drain electrode connected to the second exposed portion of the active pattern through the second contact hole.

In another aspect, a liquid crystal display device includes an active pattern and a data line formed on a substrate, a first insulating layer on the substrate, a second insulating layer on the first insulating layer above the data line, a gate electrode formed on the first insulating layer above the active pattern, a third insulating layer formed on the substrate, first and second contact holes extending through the first and third insulating layers to expose first and second portions of the active pattern, respectively, a third contact hole extending through the first, second, and third insulating layers to expose a portion of the data line, a source electrode formed on the third insulating layer, the source electrode having a first portion within the first contact hole to contact the exposed first portion of the active pattern and a second portion within the third contact hole to contact the exposed portion of the data line, and a drain electrode formed on the third insulating layer, the drain electrode having a first portion within the second contact hole to contact the exposed second portion of the active pattern and a second portion extending into a pixel region of the liquid crystal display device.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to embodiments of the present invention, examples of which are illustrated in the accompanying drawings.

Figure 1:
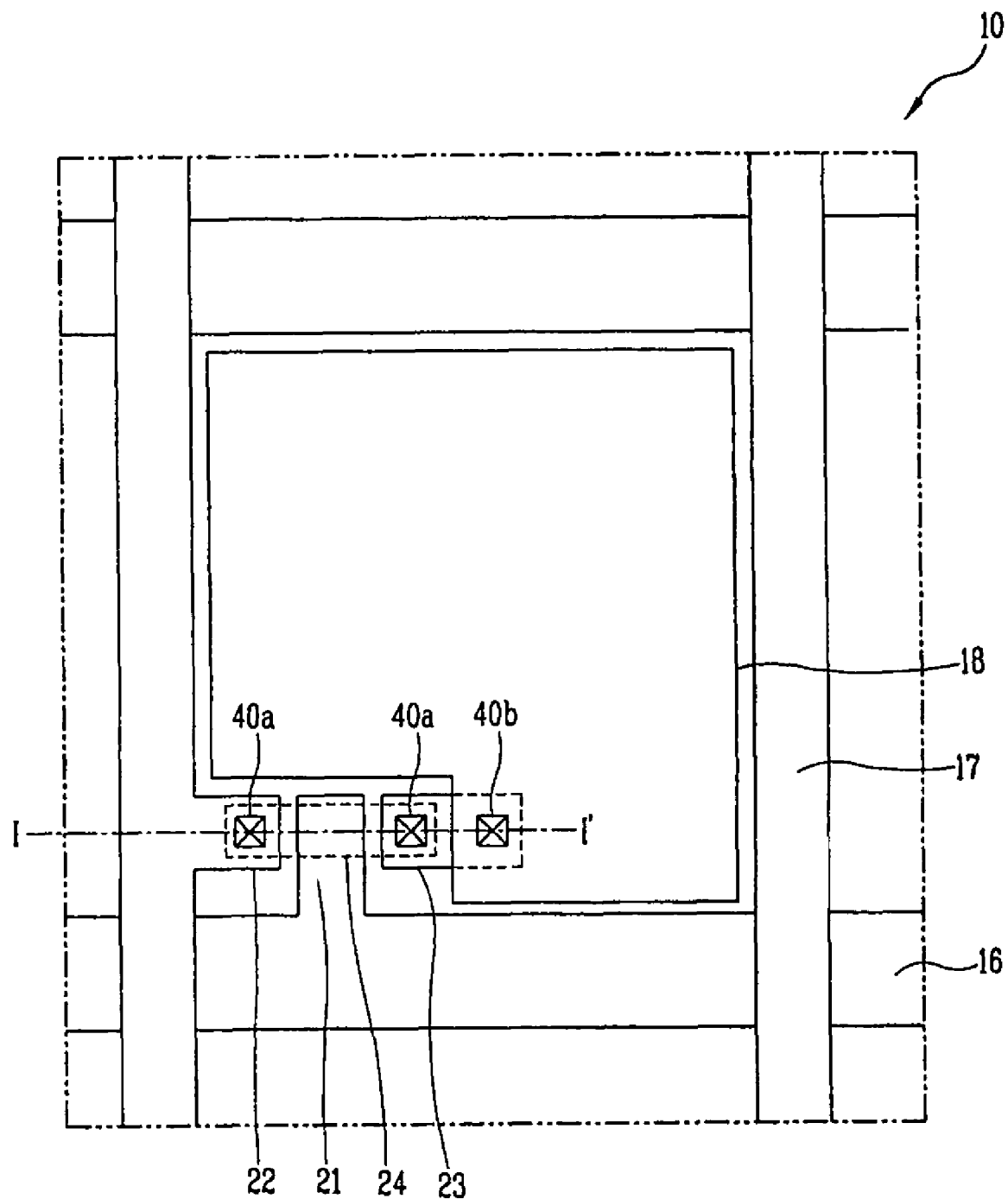
FIG. 1 is a partial plan view of an array substrate for an LCD device according to the related art.
Figure 2A:
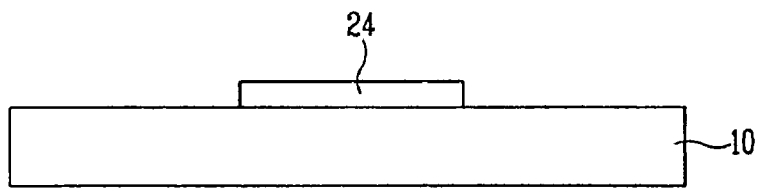
FIGS. 2A to 2F are cross sectional views along I-I' of FIG. 1 of a method for fabricating an LCD device according to the related art.
Figure 2B:
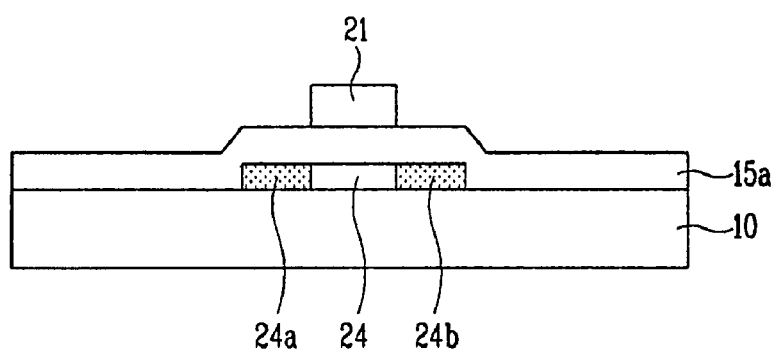
Figure 2C:
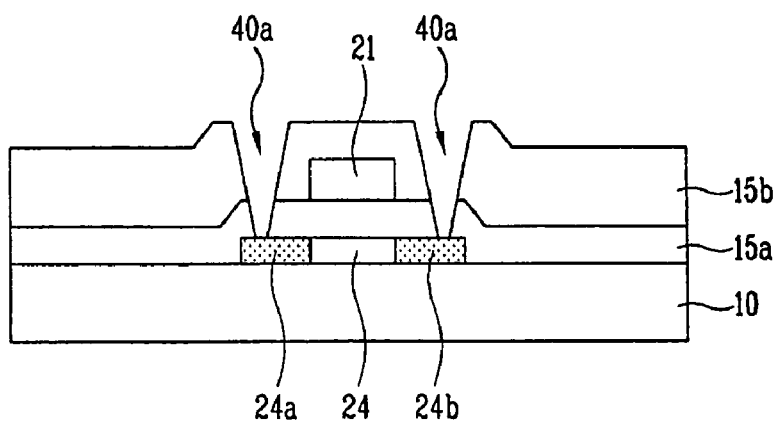
Figure 2D:
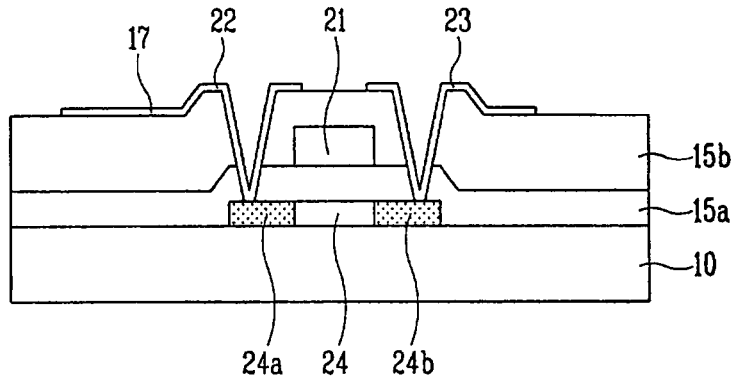
Figure 2E:
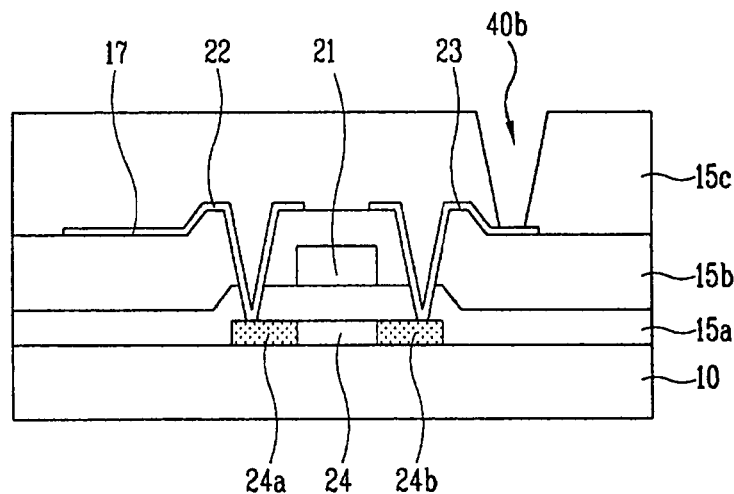
Figure 2F:
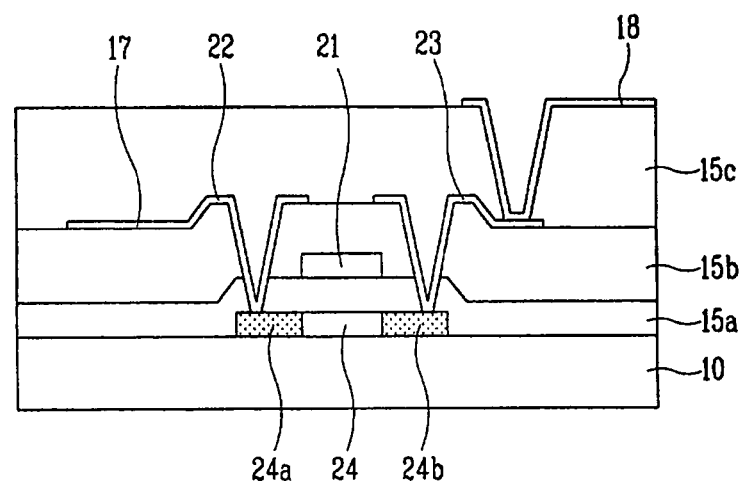
Figure 3:
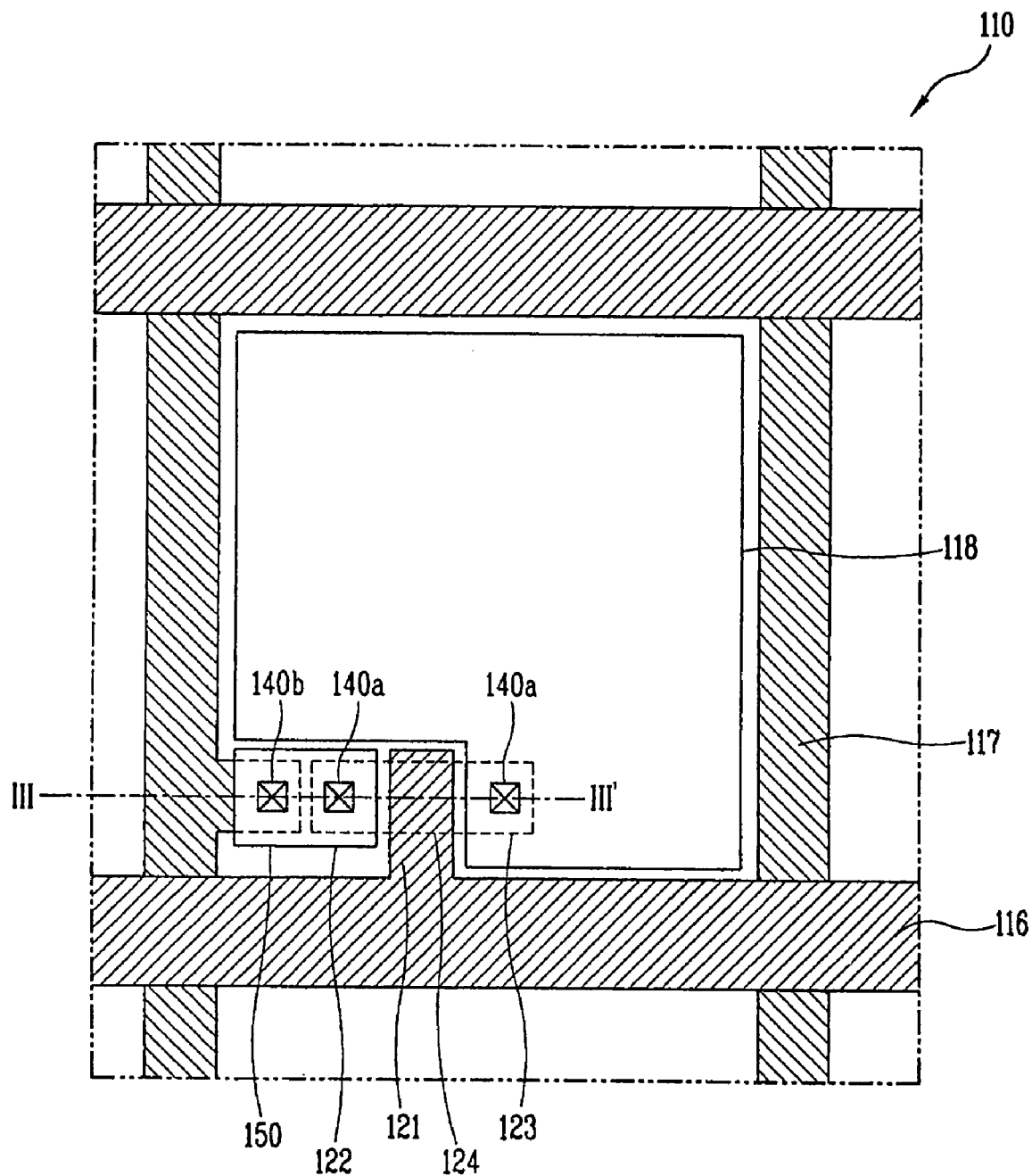
FIG. 3 is a plan view of an exemplary array substrate for an LCD device according to the present invention.

FIG. 3 is a plan view of an exemplary array substrate for an LCD device according to the present invention. Although FIG. 3 may show a single pixel, a matrix configuration of an N-number of gate lines and an M-number of data lines may be provided, thereby forming an N×M matrix configuration of pixels.

In FIG. 3, an array substrate 110 may include a pixel electrode 118 formed on a pixel region, a gate line 116 and a data line 117 arranged along horizontal and vertical directions on the substrate 110, respectively, and a TFT formed at an intersection region of the gate and data lines 116 and 117 to function as a switching device. The TFT may include a gate electrode 121 connected to the gate line 116, a source electrode 122 connected to the data line 117, and a drain electrode 123 connected to the pixel electrode 118. In addition, although not shown, the TFT may include first and second insulating layers for insulating the gate electrode 121 and the source/drain electrodes 122 and 123. Furthermore, the TFT may include an active layer 124 for creating a conductive channel between the source electrode 122 and the drain electrode 123 by an applied gate voltage to the gate electrode 121.

In FIG. 3, a portion of the source electrode 122 may be electrically connected to a source region of the active layer 124 through a first contact hole 140a formed through the second insulating layer and a third insulating layer (not shown). In addition, a portion of the drain electrode 123 may be electrically connected to a drain region of the active layer 124 through a first contact hole 140a. Accordingly, a portion of the source electrode 122 may constitute a connection electrode 150 that may be electrically connected to the data line 117 through the second contact hole 140b formed through the first insulating layer (not shown), the second insulating layer (not shown), and the third insulating layer (not shown). In addition, a portion of the drain electrode 123 may extend towards the pixel region to constitute the pixel electrode 118. The pixel electrode 118 may be formed during patterning of the source/drain electrodes 122 and 123, thereby reducing a total number of masks used for fabricating the TFT.

Figure 4A:
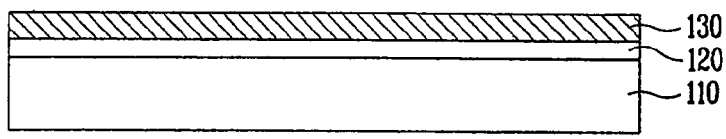
FIGS. 4A to 4E are cross sectional views along III-III' of FIG. 3 of an exemplary method of fabricating an LCD according to the present invention.

FIGS. 4A to 4E are cross sectional views along III-III' of FIG. 3 of an exemplary method of fabricating an LCD according to the present invention. In FIG. 4A, a silicon layer 120 may be formed on a transparent substrate 110 formed of a transparent insulating material, such as glass. Although not shown, a buffer layer composed of a silicon oxidation layer (SiO$_2$) may be formed on the substrate 110, and then the silicon layer 120 may be formed on the buffer layer. The buffer layer may prevent impurities, such as Na, from migrating (leaching) from the transparent substrate 110 into upper layers during subsequent fabrication processes.

The silicon layer 120 may include one of an amorphous silicon thin film and a polycrystalline silicon thin film. For purposes of explanation, the silicon layer 120 may be formed of the polycrystalline silicon thin film. The polycrystalline silicon thin film may be formed by using one of several different crystallization methods after depositing an amorphous silicon thin film on the substrate 110.

One method includes depositing amorphous silicon thin film by several different methods, such as low pressure chemical vapor deposition (LPCVD) and plasma enhanced chemical vapor deposition (PECVD). Then, a dehydrogenation process may be performed to remove hydrogen within the amorphous silicon thin film, and then crystallization of the amorphous silicon thin film may be performed. For example, the method for crystallizing the amorphous silicon thin film may include a solid phase crystallization (SPC) method and an excimer laser annealing (ELA) method using a laser. During the ELA method, a laser annealing method may include a laser pulse.

Alternatively, a sequential lateral solidification (SLS) method may be used to improve crystallization characteristics by growing grains along a horizontal direction. The SLS method make use of grain growth along a vertical direction of an interface between liquid phase silicon and solid phase silicon. Accordingly, the SLS method improves sizes of silicon grains by laterally growing the grains along a predetermined length by properly controlling an amount of laser energy and an irradiation range of a laser beam.

In FIG. 4A, a first conductive metal layer 130, such as Al, Al alloy, W, Cu, Cr, and Mo, may be formed on the polycrystalline silicon thin film 120.

Figure 4B:
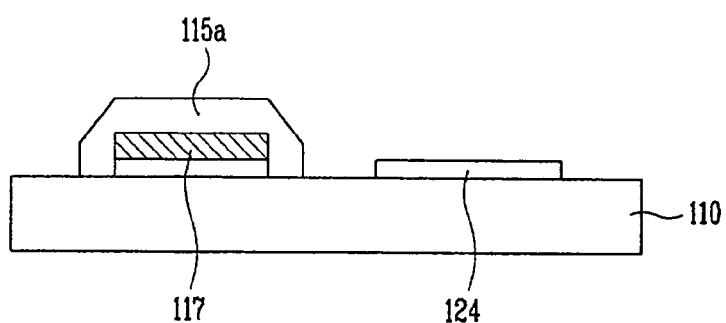

In FIG. 4B, the first conductive metal layer 130 and the polycrystalline silicon thin film 120 may be simultaneously patterned, thereby forming the data line 117 surrounded by a first insulating layer 115a and an active pattern 124.

Figure 5A:
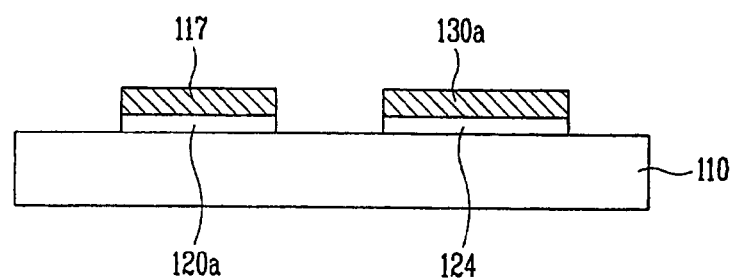
FIGS. 5A to 5C are cross sectional views of an exemplary method of fabricating an active pattern and data line of FIG. 4B according to the present invention.
Figure 5B:
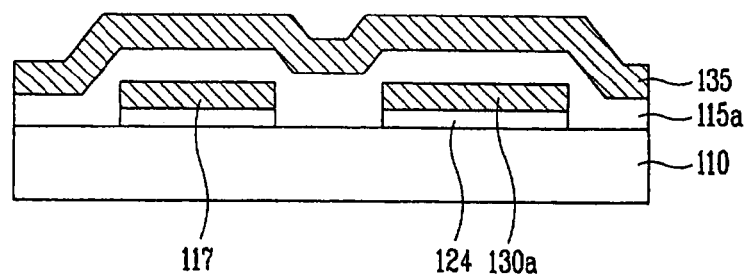
Figure 5C:
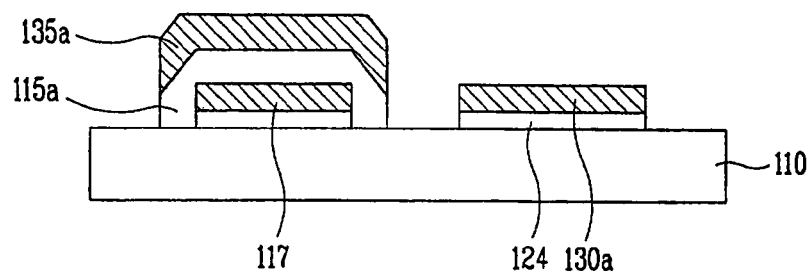

FIGS. 5A to 5C are cross sectional views of an exemplary method of fabricating an active pattern and data line of FIG. 4B according to the present invention. In FIG. 5A, the first conductive metal layer 130 and the polycrystalline silicon thin film 120 may be patterned by using a photolithographic process to form the active pattern 124 and the data line 117. Accordingly, a first conductive metal pattern 130a may have the same form as the active pattern 124, and may remain on the active pattern 124.

In FIG. 5B, in order to remove the first conductive metal pattern 130a remaining on the active pattern 124, a first insulating layer 115a and a second conductive metal layer 135 may be sequentially formed along an entire surface of the substrate 110. For example, the second conductive metal layer 135 may be formed of the same material as the first conductive metal pattern 130a remaining on the active pattern 124 both having the same thickness. Alternatively, the second conductive metal layer 135 and the first conductive metal pattern 130a may be formed of different materials both having different thicknesses. Accordingly, when the second conductive metal layer 135 is formed of a material different from that of the first conductive metal pattern 130a, the thickness of the second conductive metal layer 135 may be controlled so that the first conductive metal pattern 130a may be completely removed by a subsequent etching process.

In FIG. 5C, the second conductive metal layer 135 and the first insulating layer 115a may be patterned using a mask having the same pattern as the data line 117 and the mask may have a width larger than the data line 117, thereby forming a second conductive metal pattern 135a on the data line 117 with the first insulating layer 115a interposed therebetween. Then, the first conductive metal pattern 130a and the second conductive metal pattern 135a may be simultaneously removed, thereby exposing the active pattern 124.

Figure 4C:
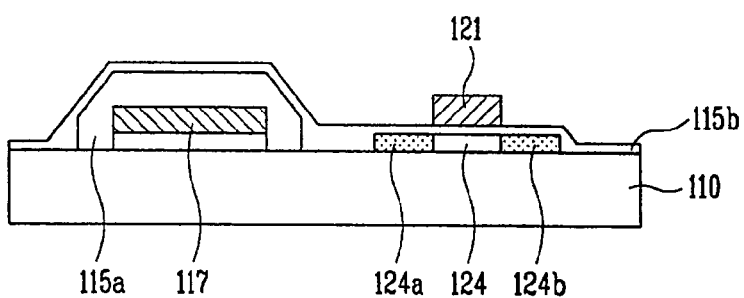

In FIG. 4C, a second insulating layer 115b, which may function as a gate insulating layer, may be deposited along an entire surface of the substrate 110. The second insulating layer 115b may be formed to be thinner than the first insulating layer 115a. Then, a gate electrode 121 of a conductive metal material may be formed on the active pattern 124 where the second insulating layer 115b may be formed. Next, impurity ions may be injected into predetermined regions of the active pattern 124 by using the gate electrode 121 as a mask, thereby forming a source region 124a and a drain region 124b. Accordingly, the gate electrode 121 may function as an ion stopper that prevents dopant ions from penetrating into a channel region of the active pattern 124.

In FIG. 4C, electric characteristics of the active pattern 124 may be varied according to the type of injected impurity ions. For example, if the injected impurity ions correspond to the third group of the Periodic Table (Group III), such as boron B, then the active pattern 124 may function as a P-type TFT. Conversely, if the injected impurity ions correspond to the fifth group of the Periodic Table (Group V), such as phosphorus P, then the active pattern 124 may function as an N-type TFT. After the impurity ion injection process, a process for activating the injected impurity ions may be performed.

Although not shown, the gate line 116 (in FIG. 3) may be formed along a vertical direction to the data line 117 during the formation of the gate electrode 121. If the first insulating layer 115a is formed on the data line 117 having a sufficient thickness with respect to the thickness of the second insulating layer 115b, then signal interference at the intersection regions between the data line 117 and the gate line 116 may be prevented.

Figure 4D:
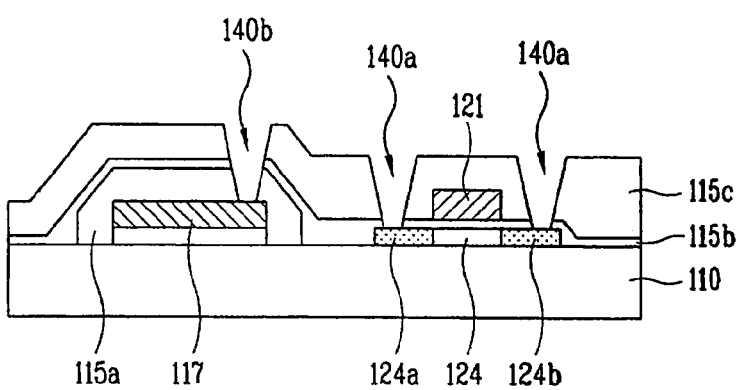

In FIG. 4D, a third insulating layer 115c may be deposited along an entire surface of the substrate 110 where the gate electrode 121 may be formed, wherein the third insulating layer 115c may be formed of a transparent organic insulating material, such as benzocyclobutene (BCB) or acryl resin, for providing a high aperture ratio. Then, the third insulating layer 115c and the second insulating layer 115b may be partially removed by a photolithographic process, thereby forming first contact holes 140a that may partially expose a source region 124a and a drain region 124b of the TFT. Then, the third insulating layer 115c, the second insulating layer 115b, and the first insulating layer 115a may be partially removed, thereby forming a second contact hole 140b that may partially expose the data line 117.

Although not shown, after patterning the third insulating layer 115c, a conductive metal layer may be deposited on the photoresist pattern and at inner portions of the first contact holes 140a and the second contact hole 140b, wherein the photoresist pattern used during the patterning may not be removed. In addition, the conductive metal layer may remain on the exposed source/drain region 124a and 124b and on the data line 117 using a lift-off process for removing the photoresist pattern using a stripper solution. Accordingly, by forming the conductive metal layer, contact resistance with a subsequently-formed transparent electrode may be reduced. The lift-off process may reduce contact resistance between electrodes by forming a barrier metal layer on the surface of the exposed electrodes of a lower layer, i.e., the exposed source/drain regions 124a and 124b, and the data line 117, by using the photoresist pattern used during the patterning without using an additional mask.

Figure 4E:
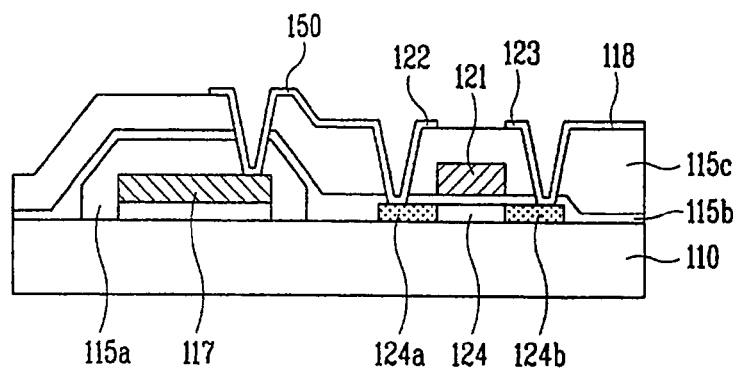

In FIG. 4E, a transparent conductive material having excellent transmissivity, such as indium tin oxide (ITO) or indium zinc oxide (IZO), may be deposited along an entire surface of the substrate 110. Then, a source electrode 122 connected to the source region 124a through the first contact hole 140a and a drain electrode 123 connected to the drain region 124b through the first contact hole 140a may be formed by a photolithographic process. Accordingly, a portion of the source electrode 122 may constitute a connection electrode 150 for electrically connecting the source region 124a and the data line 117 through the second contact hole 140b. In addition, a portion of the drain electrode 123 may extend toward the pixel region to form the pixel electrode 118.

According to the present invention, the active pattern and the data line may be simultaneously patterned to form the first contact hole and the second contact hole during a single process. In addition, a portion of the drain electrode may constitute the pixel electrode, thereby reducing a total number of process masks. Accordingly, fabrication processes are simplified and production yield may be increased and fabrication costs may be reduced.

Another embodiment for forming the active pattern and the data line by using a diffraction exposure will be explained as follows.

Figure 6A:
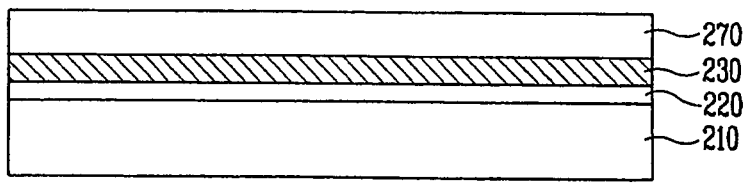
FIGS. 6A to 6F are cross sectional views of another exemplary method of fabricating an LCD device according to the present invention.

FIGS. 6A to 6F are cross sectional views of another exemplary method of fabricating an LCD device according to the present invention. In FIG. 6A, a polycrystalline silicon thin film 220 may be formed on a transparent substrate 210, such as glass. Then, a conductive metal layer 230 may be formed on the polycrystalline silicon thin film 220, and a photosensitive material 270, such as a photoresist, may be deposited with a predetermined thickness on the conductive metal layer 230. The photoresist may include a positive photoresist, such as a NOVOLAK-based resin, wherein regions exposed to light react with a developer to dissolve the light-exposed regions. Alternatively, the photoresist may include a negative photoresist of an acryl-based monomer, wherein regions not exposed to light may react with a developer to dissolve the light-shield regions. The photoresist may include one of a solvent for controlling viscosity, a photoactive-based compound for creating photosensitization, and a resin that includes a chemical binding material.

Figure 6B:
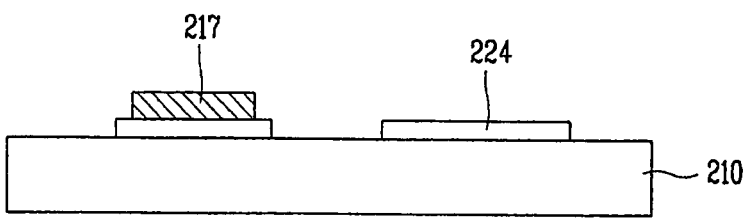

In FIG. 6B, the conductive metal layer 230 and the polycrystalline silicon thin film 220 may be patterned by applying a diffraction mask to the photoresist 270, thereby forming a data line 217 on the polycrystalline silicon thin film 220 and forming an active pattern 224.

Figure 7A:
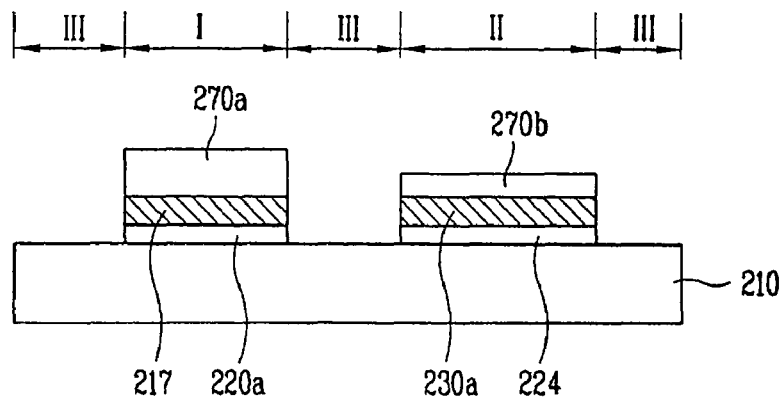
FIGS. 7A to 7C are cross sectional views of an exemplary method of fabricating an active pattern and data line of FIG. 6B according to the present invention.
Figure 7B:
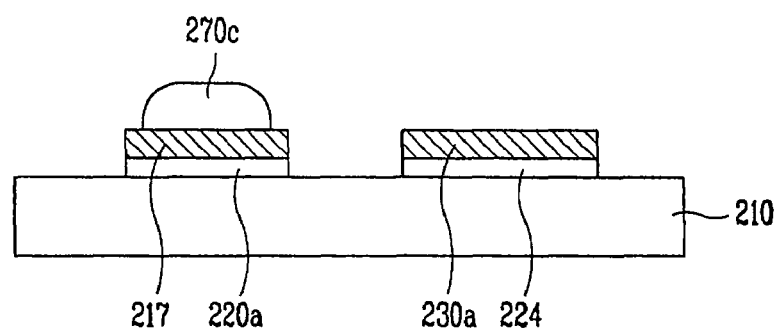
Figure 7C:
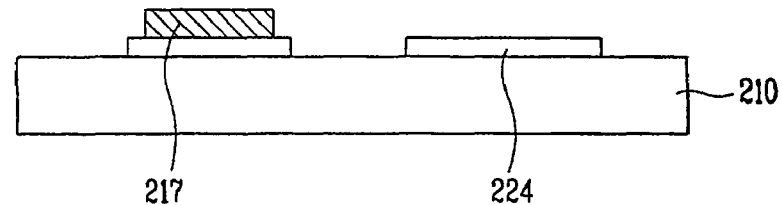

FIGS. 7A to 7C are cross sectional views of an exemplary method of fabricating an active pattern and data line of FIG. 6B according to the present invention. In FIG. 7A, a diffraction mask may be positioned on the substrate 210 where the photoresist 270 may be deposited. Then, UV light may be transmitted through the diffraction mask onto the photoresist 270. Although positive or negative photoresists may be used, according to the present invention, a negative photoresist 270 may be used.

When using the negative photoresist 270, a photolithographic process may be performed by using the diffraction mask that may include a first region I that may be a completely open pattern to allow the photoresist 270 to be exposed to the UV light such that the photoresist 270 may completely remain, a second region II that may have a slit-type open pattern to allow the photoresist 270 to be partially exposed to the UV light such that the photoresist 270 may have a reduced thickness, and a third region III that may be completely solid to prevent the photoresist 270 from being exposed to the UV light, i.e., shielded such that the photoresist may be completely removed.

Within the second region II of the diffraction mask, the slit-type open pattern may diffract the incident UV light to reduce an intensity of the UV light incident on the substrate 210. In addition, the slit-type open pattern may include a specific slit gap that may be narrower than a resolution of the UV light source. According to the present invention, although the slit-type open pattern may be used within the second region II, a semi-transmissivity layer may be used.

In FIG. 7A, by using the diffraction mask to perform the photolithographic process, a first photoresist pattern 270a of a first thickness may remain within the first region I, a second photoresist pattern 270b of a second thickness less than the first thickness may be formed within the second region II, and no photoresist pattern may be formed within the third region III. Accordingly, the conductive metal layer 230 and the polycrystalline silicon thin film 220 of the third region III where the first and second photoresist patterns 270a and 270b are not formed may be removed, thereby forming an active pattern 224 and a data line 217. In addition, a conductive metal pattern 230a and the second photoresist pattern 270b of the second thickness may remain on the active pattern 224.

In FIG. 7B, a portion of the first photoresist pattern 270a may be removed by an ashing process, wherein the photoresist material may be oxidized using oxygen gas. Accordingly, reduction of the first thickness of the first photoresist pattern 270a on the data line 217 may be precisely controlled, thereby forming a third photoresist pattern 270c of a third thickness. In addition, the second photoresist pattern 270b on the active pattern 224 may be completely removed, thereby exposing a surface of the conductive metal pattern 230a.

In FIG. 7C, the conductive metals 217 and 230a may be patterned by using the third photoresist pattern 270c as a mask, thereby completely removing the conductive metal pattern 230a remaining on the active pattern 224.

Figure 6C:
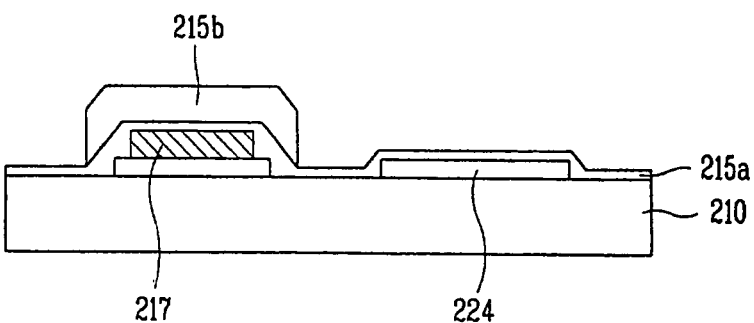

In FIG. 6C, a first insulating layer 215a may be deposited along an entire surface of the substrate 210. In addition, a second insulating layer 215b may be formed on the first insulating layer 215a, wherein the second insulating layer 215b may prevent signal interference at intersection regions of the gate and data lines 216 and 217. The first insulating layer 215a may be formed of a silicon oxidation layer at a first thickness, and the second insulating layer 215b may be formed of a silicon nitride layer with a second thickness greater than the first thickness of the first insulating layer 215a. Alternatively, the first insulating layer 215a may be formed of a silicon nitride layer, and the second insulating layer 215b may be formed of a silicon oxidation layer. Moreover, both the first insulating layer 215a and the second insulating layer 215b may be formed of a silicon oxidation layer or may be formed of a silicon nitride layer.

Then, the second insulating layer 215b may be selectively etched by using a mask having the same pattern as the data line 217 and having a width larger than a width of the data line 217. For example, when the first insulating layer 215a is formed of a silicon oxidation layer and the second insulating layer 215b is formed of a silicon nitride layer, a selective etching according to differences of etching ratios between the silicon oxidation layer and the silicon nitride layer may be performed. Accordingly, only the second insulating layer 215b may be removed on the active pattern 224.

Figure 6D:
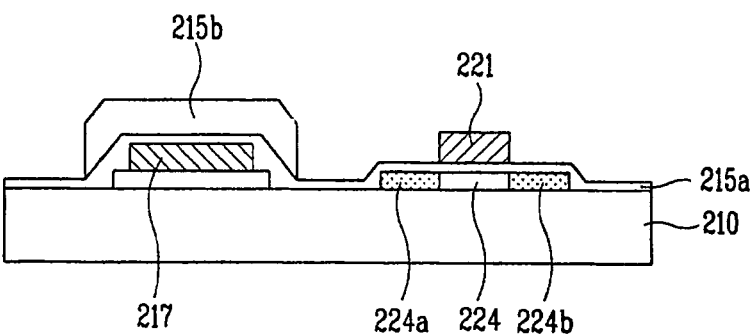

In FIG. 6D, a gate electrode 221 may be formed of a conductive metal material on the active pattern 224 where the first insulating layer 215a may be formed. Then, impurity ions may be injected into predetermined regions of the active pattern 224 by using the gate electrode 221 as a mask, thereby forming a source region 224a and a drain region 224b.

Figure 6E:
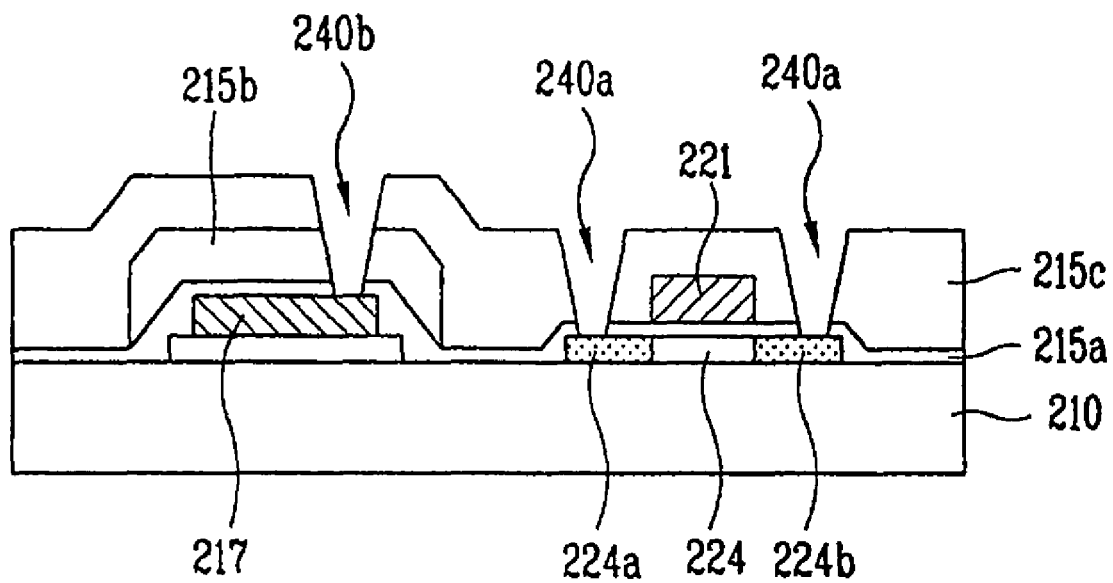

In FIG. 6E, a third insulating layer 215c may be deposited along an entire surface of the substrate 210 where the gate electrode 221 may be formed. Then, the third insulating layer 215c and the first insulating layer 215a may be partially removed by a photolithographic process to form first contact holes 240a that may expose portions of the source region 224a and the drain region 224b. In addition, the third insulating layer 215c, the second insulating layer 215b, and the first insulating layer 215a may be partially removed, thereby forming a second contact hole 240b that may expose a portion of the data line 217.

Figure 6F:
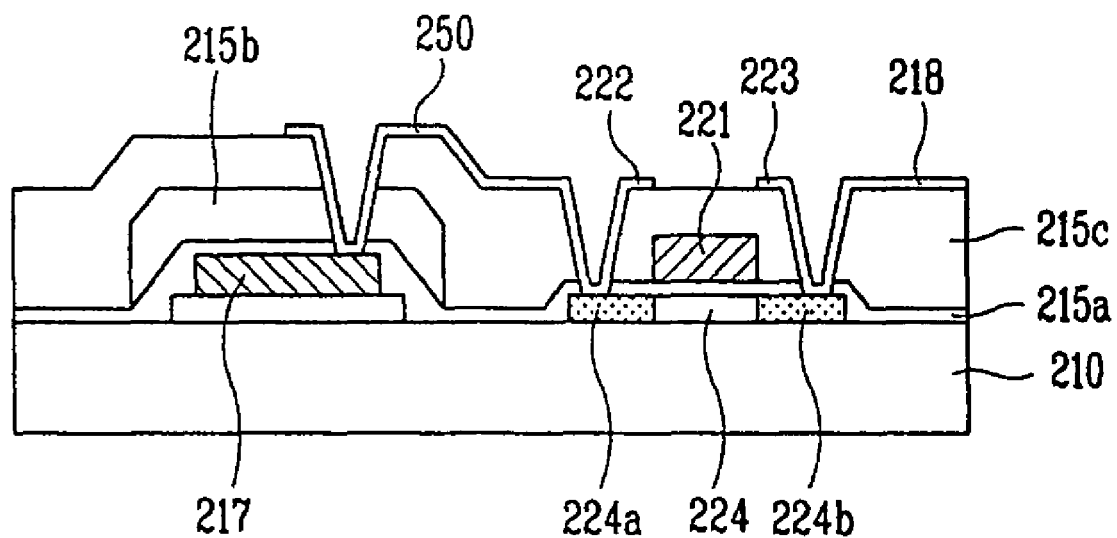

In FIG. 6F, a transparent conductive material may be deposited along an entire surface of the substrate 210. Then, the transparent conductive material may be patterned using a photolithographic process to form a source electrode 222 connected to the source region 224a through the first contact hole 240a and a drain electrode 223 connected to the drain region 224b through the first contact hole 240a. In addition, a portion of the source electrode 222 may constitute a connection electrode 250 for electrically connecting the source region 224a and the data line 217 through the second contact hole 240b. Furthermore, a portion of the drain electrode 223 may extend towards a pixel region, thereby forming a pixel electrode 218.

It will be apparent to those skilled in the art that various modifications and variation can be made in the LCD device and method of fabricating an LCD device of the present invention without departing from the spirit or scope of the invention. Thus, it is intended that the present cover the modifications and variations of this invention provided they come within the scope of the appended claims and their equivalents.

What is claimed is:

1. A liquid crystal display device, comprising:
   an active pattern and a data line formed on a substrate,
   wherein the active pattern includes a first portion of silicon layer, and the data line is a double layer structure including a first data line pattern formed of a second portion of the silicon layer and a second data line pattern formed of a conductive metal material on the second portion of the silicon layer,
   wherein the active pattern contacts a surface of the substrate and
   wherein the second data line pattern having the same form as the first data line pattern is formed on the upper portion of the first data line pattern;
   a first insulating layer on the data line;
   a second insulating layer on the substrate;
   a gate electrode formed on the second insulating layer above the active pattern;
   a third insulating layer formed on the substrate;
   first and second contact holes extending through the second and third insulating layers to expose first and second portions of the active pattern, respectively;
   a third contact hole extending through the first, second, and third insulating layers to expose a portion of the data line;
   a source electrode formed on the third insulating layer, the source electrode having a first portion within the first contact hole to contact the exposed first portion of the active pattern and a second portion within the third contact hole to contact the exposed portion of the data line; and
   a drain electrode formed on the third insulating layer, the drain electrode having a first portion within the second contact hole to contact the exposed second portion of the active pattern and a second portion extending into a pixel region of the liquid crystal display device.

2. The device according to claim 1, wherein the source electrode and the drain electrode include transparent conductive material.

3. The device according to claim 2, wherein the transparent conductive material includes one indium-tin-oxide and indium-zinc-oxide.

4. The device according to claim 1, wherein the portion of the drain that extends into the pixel region is a pixel electrode.

5. The device according to claim 1, wherein the second insulating layer directly contacts the active pattern.

* * * * *